(12) United States Patent
Pham

(10) Patent No.: US 8,410,829 B2
(45) Date of Patent: *Apr. 2, 2013

(54) METHOD AND APPARATUS SWITCHING A SEMICONDUCTOR SWITCH WITH A MULTI-STAGE DRIVE CIRCUIT

(75) Inventor: Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/466,833

(22) Filed: May 8, 2012

(65) Prior Publication Data

US 2012/0223746 A1   Sep. 6, 2012

Related U.S. Application Data

(63) Continuation of application No. 11/433,256, filed on May 12, 2006, now Pat. No. 8,207,760, which is a continuation of application No. 10/742,545, filed on Dec. 19, 2003, now Pat. No. 7,061,301.

(51) Int. Cl.
   *H03K 3/00* (2006.01)
(52) U.S. Cl. .................. 327/112; 327/109; 327/108
(58) Field of Classification Search .............. 327/112, 327/108, 109
   See application file for complete search history.

(56) References Cited

U.S. PATENT DOCUMENTS

| | | | |
|---|---|---|---|
| 5,231,311 A | 7/1993 | Ferry et al. | |
| 5,285,116 A | 2/1994 | Thaik | |
| 5,742,183 A | 4/1998 | Kuroda | |
| 5,859,552 A | 1/1999 | Do et al. | |
| 5,898,321 A | 4/1999 | Ilkbahar et al. | |
| 6,163,178 A | 12/2000 | Stark et al. | |
| 6,204,700 B1 | 3/2001 | Seyed | |
| 6,320,449 B1 | 11/2001 | Capici et al. | |
| 6,333,665 B1 * | 12/2001 | Ichikawa | 327/434 |
| 6,441,673 B1 | 8/2002 | Zhang | |
| 6,531,895 B1 | 3/2003 | Barrett et al. | |
| 6,707,325 B2 | 3/2004 | Taguchi et al. | |
| 6,724,227 B2 | 4/2004 | Imai | |

(Continued)

FOREIGN PATENT DOCUMENTS

| DE | 19855604 | 6/2000 |
|---|---|---|
| DE | 10217611 | 11/2003 |

(Continued)

OTHER PUBLICATIONS

EP 09152724.2—2215—European Office Action, dated Sep. 11, 2012 (5 pages).

(Continued)

*Primary Examiner* — Ryan Jager
(74) *Attorney, Agent, or Firm* — Blakely Sokoloff Taylor & Zafman LLP

(57) ABSTRACT

A multi-stage drive circuit is to be coupled to a semiconductor switch having a drive terminal, a first terminal and a second terminal, to switch the semiconductor switch on and off. The multi-stage drive circuit includes a first drive circuit, a second drive circuit and a selector circuit. The first drive circuit is to be coupled to provide a first drive signal to the drive terminal of the semiconductor switch and the second drive circuit is to be coupled to provide a second drive signal to the drive terminal of the semiconductor switch. The selector circuit is to be coupled to turn on the first and second drive circuits to provide the first and second drive signals to the drive terminal, respectively. The selector circuit turns on the second drive circuit responsive to a voltage between the first and second terminals of the semiconductor switch falling to a threshold value.

18 Claims, 5 Drawing Sheets

U.S. PATENT DOCUMENTS

| | | | |
|---|---|---|---|
| 6,756,826 B1 * | 6/2004 | Klein et al. | 327/112 |
| 6,809,560 B1 | 10/2004 | Wrathall | |
| 6,812,618 B2 | 11/2004 | Hayashi | |
| 6,836,173 B1 | 12/2004 | Yang | |
| 7,034,600 B2 | 4/2006 | Scheikl | |
| 7,061,301 B2 * | 6/2006 | Pham | 327/427 |
| 7,071,740 B2 | 7/2006 | Adams et al. | |
| 7,151,401 B2 * | 12/2006 | Inoue | 327/434 |
| 7,233,191 B2 | 6/2007 | Wang et al. | |
| 8,207,760 B2 * | 6/2012 | Pham | 327/112 |
| 2001/0017554 A1 | 8/2001 | Tsuji | |
| 2001/0040470 A1 * | 11/2001 | Brando et al. | 327/109 |
| 2002/0105414 A1 | 8/2002 | Arndt | |
| 2004/0021498 A1 * | 2/2004 | Scheikl | 327/427 |
| 2004/0036511 A1 | 2/2004 | Otoshi et al. | |

FOREIGN PATENT DOCUMENTS

| | | |
|---|---|---|
| EP | 0690572 | 1/1996 |
| EP | 1221771 A1 | 7/2002 |
| JP | 1-279631 | 11/1989 |
| JP | 9-46201 | 7/1995 |
| JP | 10-13206 | 1/1998 |
| JP | 2000-232347 | 2/1999 |

OTHER PUBLICATIONS

"Gate Drive Characteristics and Requirements for HEFFET®s," http://www.irf.com/technical-info/appnotes/an-937.pdf.

"DPA423-426 DPA-Switch™ Family, Highly Integrated DC-DC Converter Ics for Distributed Power Architectures," Power Ingrations, Inc., (May 2003), pp. 1-32.

"MOSFETs Basics"http://www.powerdesigners.com/InfoWeb/design_center/articles/MOSFETs/mosfets.shtm, 1998.

European Search Report, EP 04257648, Apr. 15, 2005.

European Office Action, EP 09152724, Jun. 30, 2010, 4 pages

European Search Report, EP 09152724, Oct. 27, 2009, 3 pages.

English Translation of Japanese Notice of Grounds of Rejection, JP Appl No. 365877/2004, mailed Nov. 24, 2010.

European Search Report, Application No. 10176425.6 , Oct. 27, 2010 (3 pages).

European Office Action, Application No. 09152724.2 mailed Nov. 24, 2009 (3 pages).

European Office Action, Application No. 1017425.6, mailed Nov. 10, 2010 (7 pages).

JP 365877/2004 Office Action, mailed Sep. 6, 2011 (2 pages).

* cited by examiner

METHOD AND APPARATUS SWITCHING A SEMICONDUCTOR SWITCH WITH A MULTI-STAGE DRIVE CIRCUIT

REFERENCE TO PRIOR APPLICATION

This application is a continuation of and claims priority to U.S. application Ser. No. 11/433,256, filed May 12, 2006, now pending, which is a continuation of U.S. application Ser. No. 10/742,545, filed Dec. 19, 2003, now U.S. Pat. No. 7,061,301. U.S. application Ser. No. 11/433,256 and U.S. Pat. No. 7,061,301 are hereby incorporated by reference.

BACKGROUND OF THE INVENTION

1. Field of the Invention

The present invention relates generally to semiconductor switches, and more specifically, the present invention relates to semiconductor switches being switched from an off state to an on state or from an on state to an off state.

2. Background Information

In many electronic circuits using semiconductor switches, it is important to maximize circuit efficiency. In electronic circuits using semiconductor devices that are switched at high frequency, it is therefore important to minimize losses associated with turning the semiconductor switch from an off state to an on state and from an on state to an off state, often referred to as switching losses.

When a semiconductor switch is in the off state, the current flowing through the semiconductor switch is typically substantially zero and a high voltage exists across the semiconductor switch. As the semiconductor switch is switched from an off state to an on state, the current flowing through the semiconductor switch increases and the voltage drop across the semiconductor switch falls. Since power dissipation is equal to the product of voltage and current, the total energy dissipated when switching from an off state to an on state is reduced by minimizing the period of time taken to transition from an off state to an on state.

However, simply reducing the period of time taken for a semiconductor switch to switch from an off state to an on state can introduce problems in the operation of the other circuitry in the electronic circuits of which the semiconductor switch is a part. The increased rate of change of voltage, commonly referred to as dv/dt and the increased rate of change of current, commonly referred to as di/dt, increases the electrical noise created each time the semiconductor switch switches. This electrical noise can adversely affect the operation of other circuitry and it is therefore often desirable to limit the dv/dt and di/dt to keep electrical noise to acceptable levels. The need to minimize switching losses but also limit electrical noise to acceptable levels, means the design of drive circuits that provide drive signals to switch the semiconductor switch from an off state to an on state is a compromise.

Electronic circuits using semiconductor switches where it is desirable to reduce switching losses, whilst limiting dv/dt and di/dt include switching power supplies. In these switching power supplies, the drive circuits that are coupled to apply the drive signals to switch the semiconductor switch from an off state to an on state and from an on state to an off state, often form part of a power supply controller integrated circuit. The drive circuit can also comprise a power supply controller integrated circuit and discrete components, external to the integrated circuit.

SUMMARY OF THE INVENTION

Disclosed are methods and apparatuses to switch a semiconductor switch with a multi-stage drive circuit. In one embodiment, a circuit includes a semiconductor switch adapted to switch between first and second states. The first state is one of an off state or an on state and the second state is the other one of the off state or the on state. The circuit also includes a plurality of drive circuits coupled to the semiconductor switch. The plurality of drive circuits are coupled to provide a plurality of drive signals to switch the semiconductor switch from the first state to the second state. The circuit further includes a selector circuit coupled to select the drive circuits that provide the plurality of drive signals to the semiconductor switch as the semiconductor switch switches from the first state to the second state. Additional features and benefits of the present invention will become apparent from the detailed description, figures and claims set forth below.

BRIEF DESCRIPTION OF THE DRAWINGS

The present invention detailed illustrated by way of example and not limitation in the accompanying Figures.

DETAILED DESCRIPTION

Embodiments of apparatuses and methods for implementing an improved semiconductor switch multi-stage drive circuit are disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

An improved semiconductor switch multi-stage drive circuit and method for implementing such a circuit in accordance with the teachings of the present invention will now be described. Embodiments of the present invention involve methods and apparatuses to reduce switching losses in semiconductor switches switching from an off state to an on state and/or from an on state to an off state. Throughout the specification, drive circuits for an n-channel metal oxide field effect transistor (MOSFET) semiconductor switch are specified by way of example. The techniques disclosed may however be applied to a p-channel MOSFET and other types of semiconductor switches as will be known to one skilled in the art having the benefit of this disclosure. Similarly, references are made throughout this disclosure specifically to a switching transition of a semiconductor switch from an off state to an on state. It will be appreciated to one skilled in the art having the benefit of this disclosure that the techniques discussed can also be applied to a switching transition of a semiconductor switch from an on state to an off state.

Figure 1:
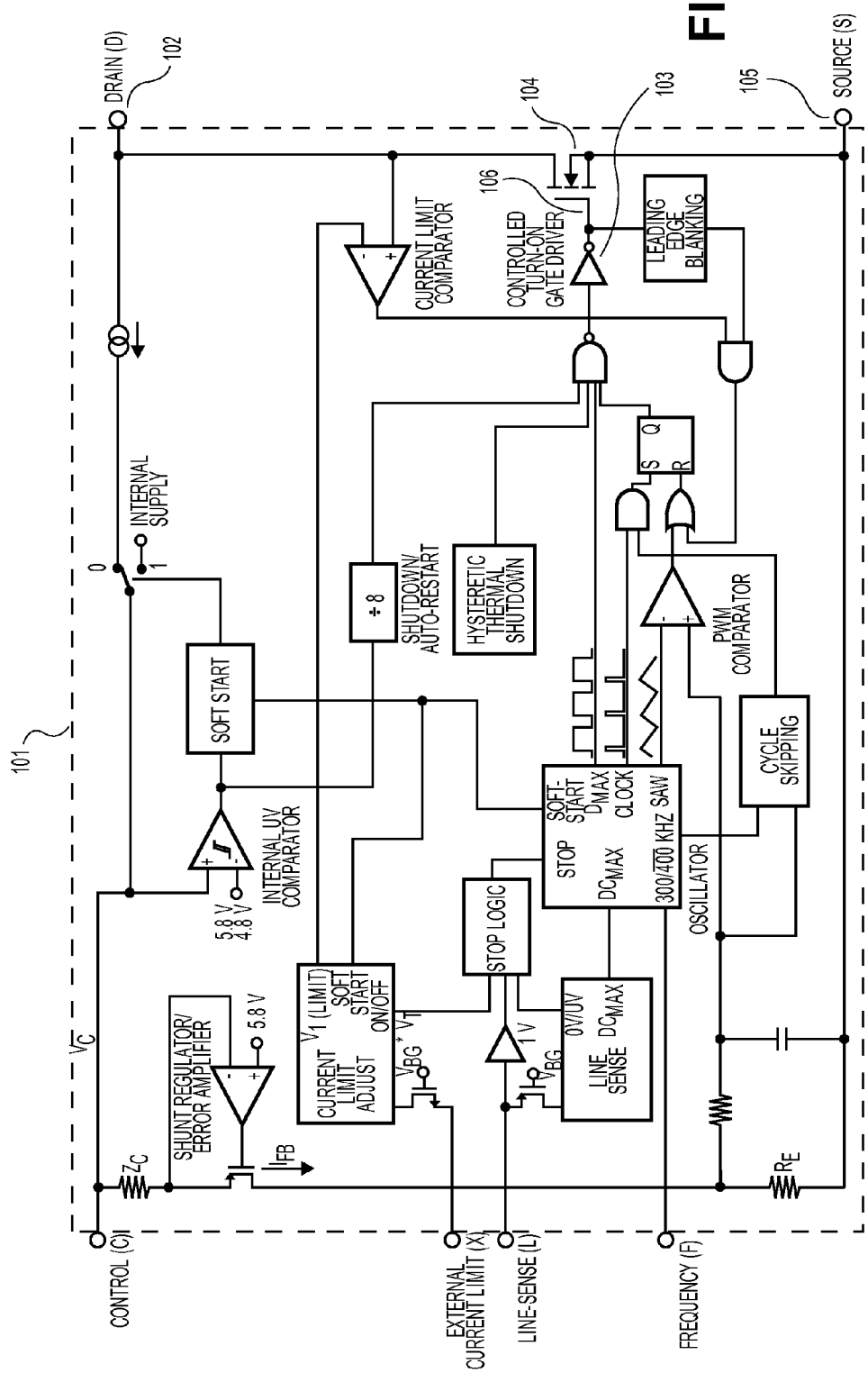
FIG. 1 is a block diagram of a switching power supply control circuit employing a semiconductor switch and a semiconductor switch drive circuit.

FIG. 1 shows a block diagram of one example of a power supply controller 101 that could benefit from a drive circuit according to embodiments of the present invention. The power supply controller 101 includes a drive circuit 103, which applies drive signals to the drive terminal 106, often referred to as the GATE terminal, of MOSFET semiconductor switch 104 to switch MOSFET 104 from an off state to an on state and from an on state to an off state. MOSFET 104 further comprises voltage reference or SOURCE terminal 105 and DRAIN terminal 102.

Figure 2:
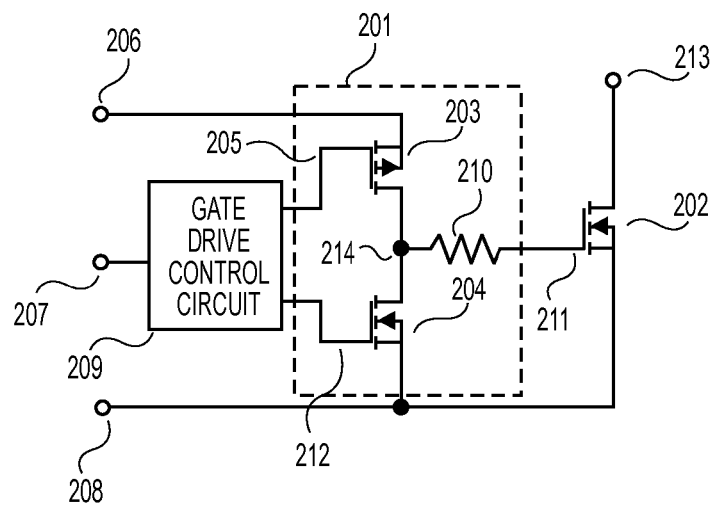
FIG. 2 is a schematic of a semiconductor switch and drive circuit.

FIG. 2 shows the schematic of a circuit coupled to drive a MOSFET 202. The circuit comprises drive circuit 201 including a p-channel MOSFET 203 coupled to provide a drive signal at drive terminal 211 to switch MOSFET 202 from an off state to an on state. Drive circuit 201 further comprises an n-channel MOSFET 204 coupled to provide a drive signal at drive terminal 211 to switch MOSFET 202 from an on state to an off state. In common with the rest of this disclosure, the description below focuses on the switching transition of MOSFET 202 from the off state to the on state though one skilled in the art will appreciate that the teachings are equally relevant to switching from the on state to the off state.

The speed with which MOSFET 202 is switched from the off state to the on state is governed in part by the impedance between the supply rail 206 and the gate 211. The lower this impedance, the faster the transition of MOSFET 202 from off state to on state. The total impedance of the drive circuit is the impedance 210 in addition to the on resistance of p-channel MOSFET 203. The on resistance of p-channel MOSFET 203 is influenced by the voltage at the gate 205 node relative to its source terminal 206. In the illustrated schematic of FIG. 2, Gate Drive Control Circuit 209 provides a fixed voltage at terminal 205 to turn MOSFET 203 on. With this type of drive circuit, the on resistance of MOSFET 203 is substantially fixed while the MOSFET 202 is turned from an off state to an on state.

However, a more sophisticated control of the drive circuit 201 may be achieved if Gate Drive Control Circuit 209 provides a first voltage at terminal 205 for a first time period and a second voltage for a second time period while MOSFET 202 is switching from an off state to an on state. In this way, the drive circuit 201 impedance can be varied during the transition of MOSFET 202 from an off state to an on state as described below.

Figure 3:
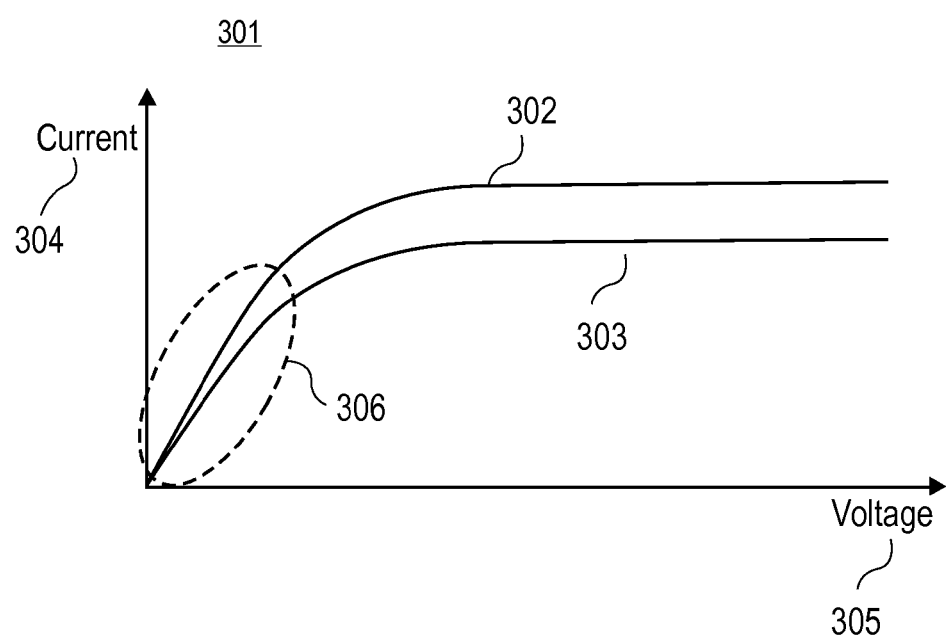
FIG. 3 shows typical output characteristics of a semiconductor switch.

FIG. 3 shows two curves 301 commonly referred to as output characteristic curves typical of a MOSFET such as MOSFET 203. These curves describe the voltage between terminals 206 and 214 as a function of the current flowing between terminals 206 and 214. The MOSFET 203 would normally be designed to operate in the region indicated as 306. The output characteristic in this region describes a substantially linear relationship between voltage and current and therefore describes a substantially resistive characteristic.

Curve 303 describes the output characteristic with a specific voltage applied to the gate terminal 205 relative to the source terminal 206. The curve 302 describes an output characteristic with a higher relative voltage applied between the gate terminal 205 and source terminal 206.

For the purposes of this description, curve 302 will be referred to as the fully enhanced output characteristic, which is a relatively stable characteristic with manufacturing variations and temperature compared to the partially enhanced characteristic of curve 303, which varies significantly with the gate threshold voltage of the MOSFET 203 over temperature and manufacturing variations. As can be seen, characteristic 302 has a steeper slope in region 306 and therefore describes a lower resistance than curve 303. In one embodiment, it is this reduced resistance that is used in the second time period described above that allows the drive circuit 201 impedance to be varied during the transition of MOSFET 202 from an off state to an on state in accordance with the teachings of the present invention. An advantage of varying the drive circuit 201 impedance in this way is illustrated in FIGS. 4A and 4B.

Figure 4A:
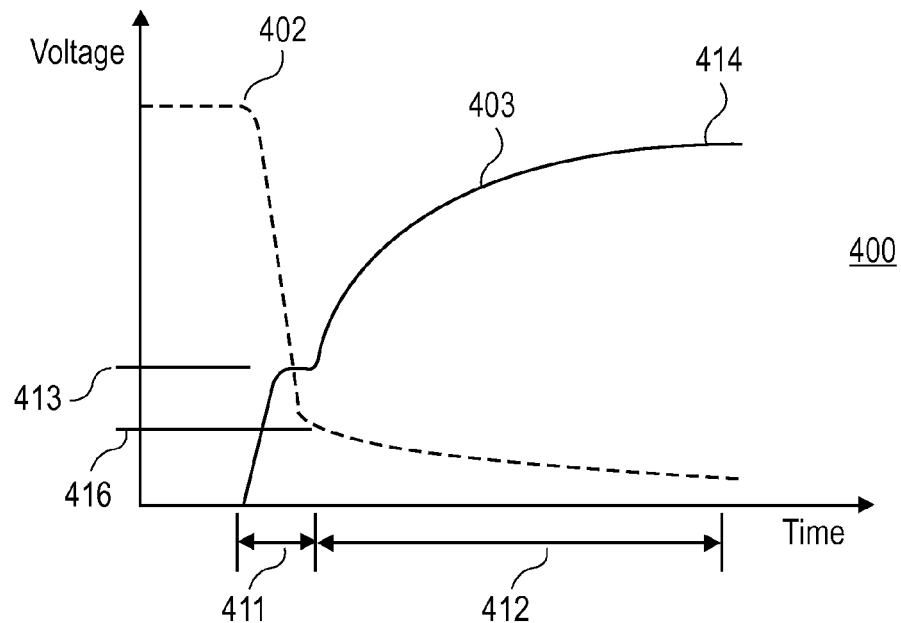
FIG. 4 shows waveforms of a semiconductor switch drive signal and the voltage across a semiconductor switch switching from an off state to an on state.

Curves 400, in FIG. 4A show gate and drain voltage curves 403 and 402, respectively, of the gate and drain terminals 211 and 213, respectively, relative to reference voltage terminal 208 while MOSFET 202 is switching from an off state to an on state. The voltage at the drain terminal 213 would typically be much higher in value than the voltage at the gate terminal 211, but for the purposes of this description is shown on the same voltage scale as the gate voltage curve 403. The curves 400 and 401 in FIGS. 4A and 4B are not drawn to scale but are instead used to illustrate the influence of the gate drive circuit that is the subject of this disclosure. The exact semiconductor switch parameters that give rise to the switching waveforms shown in FIGS. 4A and 4B are not described here so as not to obscure the teachings of the present invention and will be apparent to one skilled in the art having the benefit of this disclosure.

During a first time period 411, the gate voltage curve 403 rises and the drain voltage curve 402 begins to fall. Due to the characteristics of the capacitance of the gate 211 of the MOSFET 202, the voltage at gate 211 of MOSFET 202 is temporarily clamped at voltage level 413 until the voltage at drain 213 reaches a value 416. At this time, the voltage at gate 211 of MOSFET 202 is then unclamped and rises to a final value 414 in a second time period 412, the duration of which is governed by the impedance of the drive circuit 201 as described above. As shown in the depicted embodiment, second time period 412 is after first time period 411 and begins after the drain voltage curve 402 has already begun to fall. Throughout second time period 412, as the gate voltage curve 403 rises, the on resistance of the MOSFET 202 falls to a minimum value when the full gate voltage 414 is present on the gate 211.

Figure 4B:
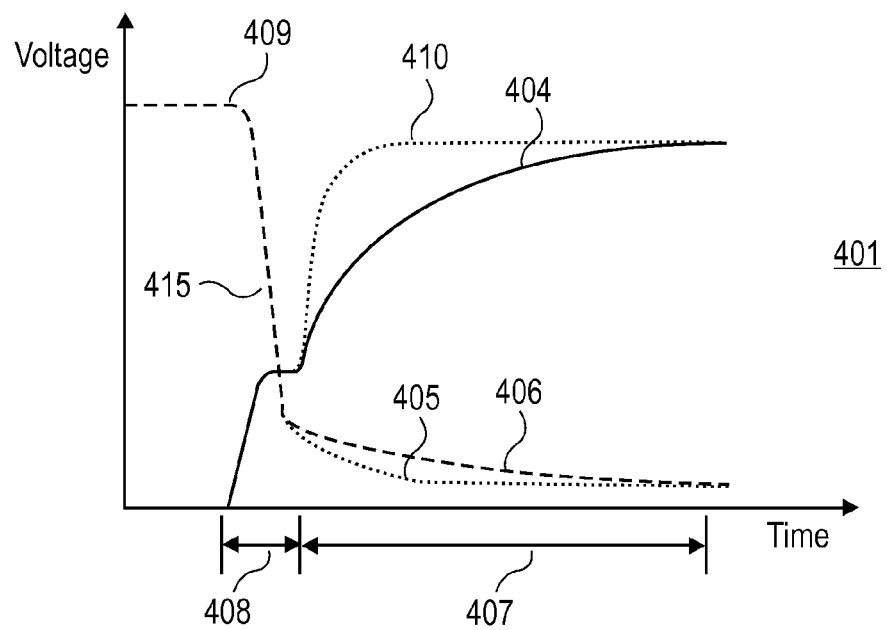

FIG. 4B illustrates the influence of varying the gate drive circuit impedance discussed above with reference to FIG. 2. Similar to FIG. 4A, Curves 401 in FIG. 4B show gate and drain voltage curves 404 and 409, respectively, of the gate and drain terminals 211 and 213, respectively, relative to reference voltage terminal 208 while MOSFET 202 is switching from an off state to an on state. If the drive circuit impedance is reduced at the start of the second time period 407, the rise time of gate voltage curve 404 of MOSFET 202 during the second time period 407 is reduced to that illustrated with gate voltage curve 410 and the drain voltage of MOSFET 202 falls more rapidly as illustrated by curve 405 reducing the losses during the transition from an off state to an on state relative to the previous characteristic shown by curve 406. As shown in the depicted embodiment, second time period 407 is after first time period 408 and begins after the drain voltage curve 409 has already begun to fall. The time at which to begin the second time period can be sensed in a number of ways, such as for example by coupling gate drive circuit 209 to MOSFET 202 gate terminal 211, though this is not shown in FIG. 2 since this has also been used to describe the operation of the simplest drive circuit above where the drive circuit impedance is not varied.

However, reducing the drive circuit 201 impedance by providing a first fixed voltage at terminal 205 for a first time period and a second fixed voltage for a second time period while MOSFET 202 is transitioning from an off state to an on state, gives inconsistent results when used in high volume production circuits. The output characteristics of MOSFET 203 vary considerably over temperature and manufacturing variations. As such it is difficult to predict the exact performance of this circuit in operation and therefore the benefits that will be obtained.

Figure 5:
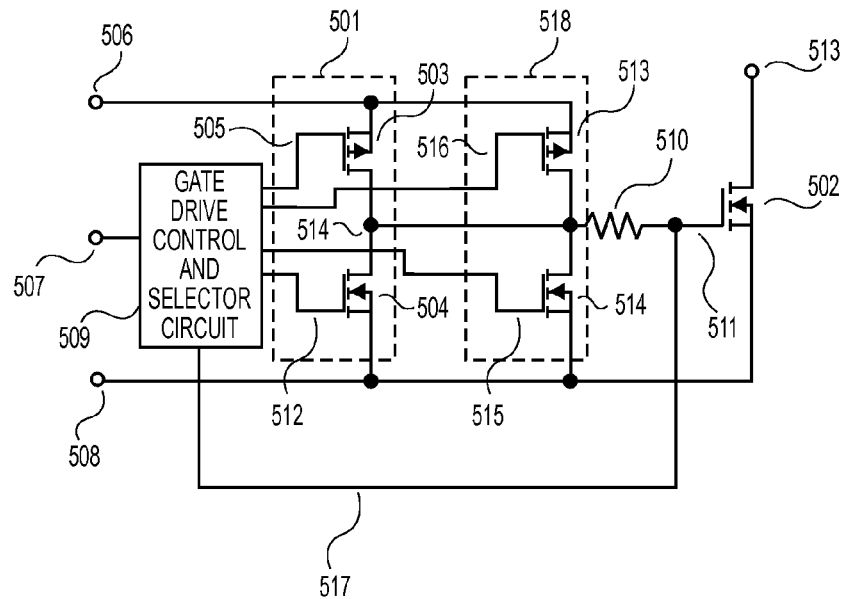
FIG. 5 shows one embodiment of a circuit benefiting from the teachings of the present invention.

FIG. 5 shows another embodiment of a circuit benefiting from the teachings of the present invention. A first drive circuit 501 includes a p-channel MOSFET 503 and an n-channel MOSFET 504. A second drive circuit 518 includes a p-channel MOSFET 513 and an n-channel MOSFET 514. For the purposes of this description, impedance 510 is shown outside the drive circuits 501 and 518 since it offers the same impedance with both. The Gate Drive Control and Selector circuit 509 has an input 507 and separate outputs to individually drive MOSFETs 503, 504, 513 and 514.

In operation, during the switching of MOSFET 502 from an off state to an on state, MOSFET 503 is turned on for a first time period providing a first drive signal. The selector circuit 509 then turns on MOSFET 513 during a second time period providing a second drive signal. In the embodiment shown in FIG. 5, the Gate Drive Control and Selector circuit 509 is coupled to the gate 511 of MOSFET 502 using connection 517. In one embodiment, this coupling provides a way in which the Gate Drive Control and Selector circuit 509 can sense the appropriate time to turn on the second drive circuit 518.

When the voltage between the drive or gate terminal 511 and reference voltage or source terminal 508 reaches a voltage threshold value determined in the design of circuit 509, the second time period is started as described with reference to FIG. 4 above. Depending on the embodiment, the selector circuit within circuit 509 can be designed to turn off MOSFET 503 at the end of the first period or keep MOSFET 503 on for both the first and second time periods.

The embodiment illustrated in FIG. 5 differs from the scheme described with reference to FIG. 2, where the gate voltage of MOSFET 205 is varied in order to vary the impedance of drive circuit 201. For example, one difference is that the degree of impedance change from the first time period to the second time period can accurately be predicted since both MOSFETs 503 and 513 in one embodiment are driven to be fully enhanced and therefore exhibit the relatively stable characteristics of the fully enhanced output characteristic described above with reference to FIG. 3 curve 302. Furthermore, the combined impedance of drive circuits 501 and 518 is easier to control than the drive circuit of FIG. 2 since, for example, MOSFET 503 can be turned off for the duration of the second time period or left on.

In one embodiment, if a plurality of more than two drive circuits are employed, there is even more flexibility in the variation of combined impedance possible by selecting various combinations of MOSFETs to be on and off during the first and second time periods. In all cases, since the MOSFETs are driven with the fully enhanced characteristic, their output characteristics and therefore the characteristics of MOSFET 502 as it switches from an off state to an on state are easier to predict. In a case where a plurality of more than two drive circuits are employed, it is also clear that the MOSFET 502 could be switched from an off state to an on state using a plurality of time periods between which the impedance of the combined impedance of the plurality of drive circuits would be varied. The remaining descriptions in this disclosure focus on the use of two drive circuits so as not to obscure the teachings of the present invention.

Figure 6:
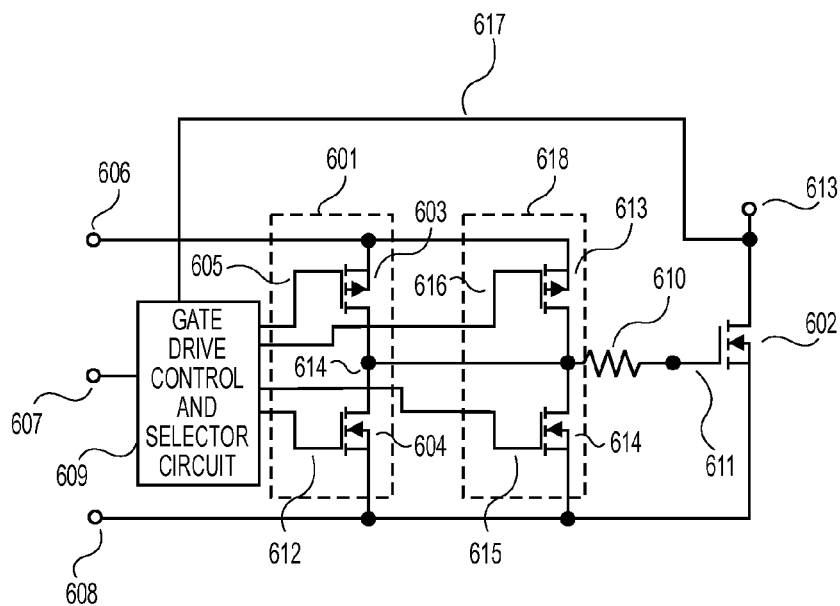
FIG. 6 shows another embodiment of a circuit benefiting from the teachings of the present invention.

FIG. 6 shows another embodiment of a circuit benefiting from the teachings of the present invention. Again two drive circuits 601 and 618 act as first and second drive circuits independently providing first and second drive signals respectively to the gate of MOSFET 602. However, the sense signal used to determine the start of the second time period is coupled from the gate drive control and selector circuit 609 to the drain 613 of MOSFET 602 through connection 617. With reference to FIG. 4B, it can be seen that this is also a way of detecting when the fast change in the voltage drop across MOSFET 602 over a time period (dv/dt) transition 415 of the voltage across MOSFET 602 has finished or when the voltage across MOSFET 602 has fallen to or reached a voltage threshold value after dv/dt transition 415. At this point, it is the correct time to start the second time period 407 to help ensure the voltage across MOSFET 602 follows characteristic 405 rather than characteristic 406 in accordance with the teachings of the present invention.

Figure 7:
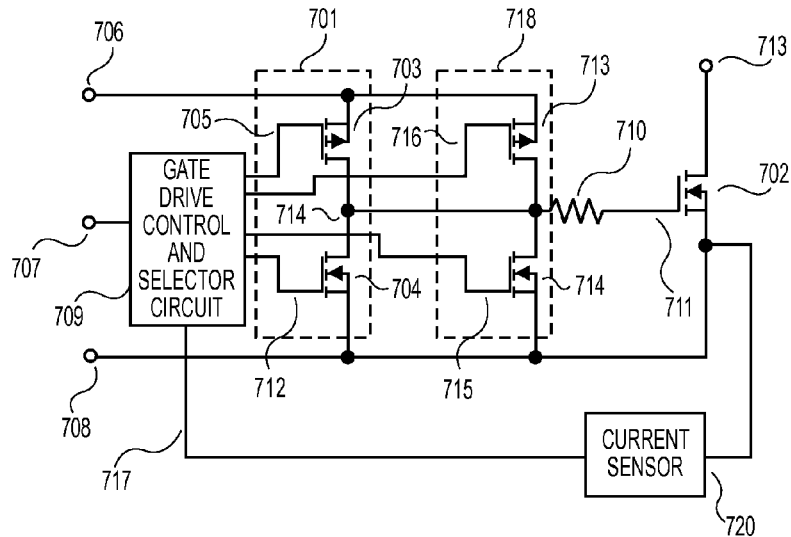
FIG. 7 shows yet another embodiment of a circuit benefiting from the teachings of the present invention.

FIG. 7 shows another embodiment of a circuit benefiting from the teachings of the present invention. As shown in the depicted embodiment, a current sensor 720 is coupled to MOSFET 702 to sense the current flowing between drain 713 and source 708 terminals of MOSFET 702. Current sensor 720 may sense the current flowing through MOSFET 702 using a variety of well-known techniques, which are not shown herewith so as not to obscure the teachings of the present invention. Current sensor 720 is coupled to gate drive control and selector circuit 709 through connection 717. By sensing the current flowing in MOSFET 702 during the transition from an off state to an on state in this way the selector circuit within circuit 709 can be designed to use this information to sense when the current flowing in MOSFET 702 crosses a current threshold value to determine the correct time for the second time period 407 to start.

Figure 8:
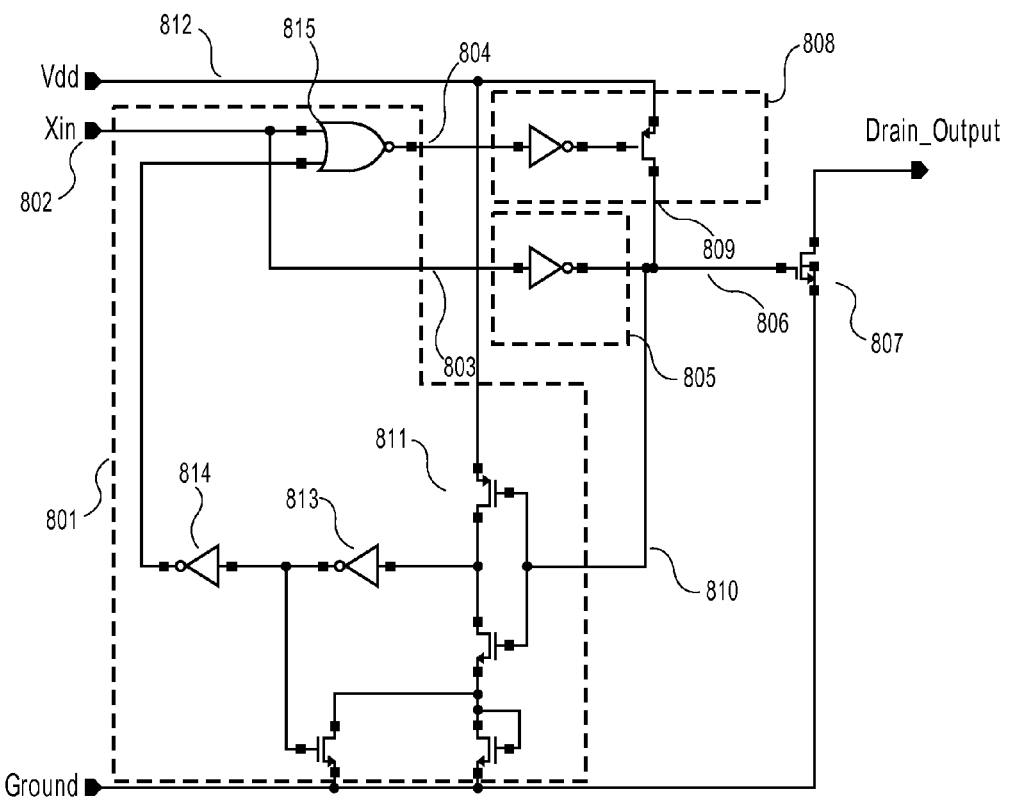
FIG. 8 shows yet another embodiment of a circuit benefiting from the teachings of the present invention.

FIG. 8 shows another embodiment of a circuit benefiting for the teachings of the present invention. As shown in the depicted embodiment, Gate Drive and Selector Circuit 801 has an input 802 and two outputs 803 and 804. Output 803 is the input to first drive circuit 805. Gate Drive and Selector Circuit 801 is coupled to sense through connection 810 the output of first drive circuit 805. Drive circuit 805 includes circuitry to provide a drive signal to drive the drive terminal or gate 806 of semiconductor switch or MOSFET 807 to switch it from an off state to an on state and also to drive it from an on state to an off state.

As shown in the illustrated embodiment, a second drive circuit 808 only provides a second drive signal from output 809 to MOSFET 807 drive terminal or gate 806 when MOSFET 807 is switching from an off state to an on state. Therefore, when MOSFET 807 is switching from an on state to an off state, only one drive signal from drive circuit 805 is provided in this embodiment. When Gate Drive Control and Selector circuit 801 senses through connection 810 that the voltage on the gate 806 of MOSFET 807 reaches a threshold value determined by the gate threshold voltage of p-channel MOSFET 811 and the value of the voltage on supply rail 812, MOSFET 811 turns off and the outputs of inverter gates 813 and 814 change polarity, which in turn causes the output 804 of NOR gate 815 change polarity to a high state. This turns on second drive circuit 808, increasing the drive to gate 806 of MOSFET 807 in accordance with the teachings of the present invention.

It is appreciated that the first drive circuit 805 can be designed to provide the desired turn on characteristic of MOSFET 807, whilst the second drive circuit 808 increases the gate drive to MOSFET 807 once the gate has reached a threshold value to reduce the losses as the MOSFET 807 settles to its final on resistance value in accordance with the teachings of the present invention In the foregoing detailed description, the method and apparatus of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive.

What is claimed is:

1. A multi-stage drive circuit to be coupled to a semiconductor switch having a drive terminal, a first terminal and a second terminal, to switch the semiconductor switch between on and off states, the multi-stage drive circuit comprising:
    a first drive circuit to be coupled to provide a first drive signal to the drive terminal of the semiconductor switch;
    a second drive circuit to be coupled to provide a second drive signal to the drive terminal of the semiconductor switch; and
    a selector circuit to be coupled to turn on the first and second drive circuits to provide the first and second drive signals to the drive terminal, respectively, wherein the selector circuit turns on the second drive circuit responsive to a voltage between the first and second terminals of the semiconductor switch falling to a threshold value.

2. The multi-stage drive circuit of claim 1, wherein the selector circuit turns off the first drive circuit once the second drive circuit is on.

3. The multi-stage drive circuit of claim 1, wherein the selector circuit is to be coupled to the first terminal of the semiconductor switch to monitor the voltage between the first and second terminals.

4. The multi-stage drive circuit of claim 1, wherein the selector circuit turns on the second drive circuit substantially immediately after the voltage between the first and second terminals of the semiconductor switch has fallen to the threshold value.

5. The multi-stage drive circuit of claim 1, further comprising a current sensor to be coupled between the semiconductor switch and the selector circuit.

6. The multi-stage drive circuit of claim 5, wherein the selector circuit turns on the second drive circuit in response to a current flow between the first terminal and the second terminal reaching a current threshold value.

7. The multi-stage drive circuit of claim 1, wherein the second drive circuit has a different drive impedance than the first drive circuit.

8. A multi-stage drive circuit to be coupled to a semiconductor switch having a drive terminal, a first terminal and a second terminal, to switch the semiconductor switch between on and off states, the multi-stage drive circuit comprising:
    a first drive circuit to be coupled to provide a first drive signal to the drive terminal of the semiconductor switch;
    a second drive circuit to be coupled to provide a second drive signal to the drive terminal of the semiconductor switch; and
    a selector circuit to be coupled to turn on the first and second drive circuits to provide the first and second drive signals to the drive terminal, respectively, wherein the selector circuit turns on the second drive circuit responsive to a current flow between the first terminal and the second terminal reaching a current threshold value, wherein the selector circuit is to be further coupled to the first terminal of the semiconductor switch to monitor a voltage between the first and second terminals, and wherein the selector circuit turns on the second drive circuit in response to the voltage between the first and second terminals of the semiconductor switch falling to a threshold value.

9. The multi-stage drive circuit of claim 8, wherein the selector circuit turns off the first drive circuit once the second drive circuit is on.

10. The multi-stage drive circuit of claim 8, wherein the selector circuit turns on the second drive circuit substantially immediately after the current flow between the first terminal and the second terminal reaches the current threshold value.

11. The multi-stage drive circuit of claim 8, further comprising a current sensor to be coupled between the semiconductor switch and the selector circuit, wherein the current sensor monitors the current flow between the first terminal and the second terminal.

12. The multi-stage drive circuit of claim 8, wherein the second drive circuit has a different drive impedance than the first drive circuit.

13. A multi-stage drive circuit to be coupled to a semiconductor switch having a drive terminal, a first terminal and a second terminal, to switch the semiconductor switch between on and off states, the multi-stage drive circuit comprising:
    a first drive circuit to be coupled to provide a first drive signal to the drive terminal of the semiconductor switch;
    a second drive circuit to be coupled to provide a second drive signal to the drive terminal of the semiconductor switch; and
    a selector circuit to be coupled to turn on the first and second drive circuits to provide the first and second drive signals to the drive terminal, respectively, wherein a voltage at the drive terminal of the semiconductor switch temporarily clamps at a first voltage level during a time that the first drive circuit is providing the first drive signal and wherein the selector circuit turns on the second drive circuit after the voltage at the drive terminal unclamps and rises from the first voltage level, wherein the selector circuit is to be further coupled to the first terminal of the semiconductor switch to monitor the voltage between the first and second terminals, and wherein the selector circuit turns on the second drive circuit responsive to the voltage between the first and second terminals falling to a threshold value indicating a time at which the voltage at the drive terminal unclamps and rises from the first voltage level.

14. The multi-stage drive circuit of claim 13, wherein the voltage between the first and second terminals has a fast changing time period transition and a subsequent slower changing time period transition, and wherein the selector circuit turns on the second drive circuit after the fast changing time period transition is finished.

15. The multi-stage drive circuit of claim 13, wherein the selector circuit turns on the second drive circuit substantially immediately after the voltage between the first and second terminals of the semiconductor switch has fallen to the threshold value.

16. The multi-stage drive circuit of claim 13, wherein the selector circuit turns off the first drive circuit once the second drive circuit is on.

17. The multi-stage drive circuit of claim 13, further comprising a current sensor to be coupled between the semiconductor switch and the selector circuit, and wherein the selector circuit turns on the second drive circuit in response to a current flow between the first terminal and the second terminal reaching a current threshold value indicating a time at which the voltage at the drive terminal unclamps and rises from the first voltage level.

18. The multi-stage drive circuit of claim 13, wherein the second drive circuit has a different drive impedance than the first drive circuit.

* * * * *